United States Patent [19]

Clifton et al.

[11] Patent Number: 5,480,842
[45] Date of Patent: Jan. 2, 1996

[54] METHOD FOR FABRICATING THIN, STRONG, AND FLEXIBLE DIE FOR SMART CARDS

[75] Inventors: Mark B. Clifton, Robbinsville, N.J.; Richard M. Flynn, Noblesville, Ind.; Fred W. Verdi, Lawrenceville, N.J.

[73] Assignee: AT&T Corp., Murray Hill, N.J.

[21] Appl. No.: 225,687

[22] Filed: Apr. 11, 1994

[51] Int. Cl.[6] ................................................. H01L 21/304
[52] U.S. Cl. ........................ 437/226; 437/225; 437/974; 257/679
[58] Field of Search ................................ 437/226, 225, 437/228, 974; 148/DIG. 28, DIG. 51; 257/679

[56] References Cited

U.S. PATENT DOCUMENTS

| | | | |
|---|---|---|---|
| 3,631,307 | 12/1971 | Naugler | 317/235 R |
| 3,702,464 | 11/1972 | Castrucci | 340/173 |
| 4,266,334 | 5/1981 | Edwards et al. | 437/226 |
| 4,417,413 | 11/1983 | Hoppe et al. | 40/630 |
| 4,862,490 | 8/1989 | Karnezos et al. | 378/161 |
| 4,889,980 | 12/1989 | Hara et al. | 235/488 |
| 5,127,984 | 7/1992 | Hua et al. | 156/639 |
| 5,250,600 | 10/1993 | Nguyen et al. | 524/377 |
| 5,255,430 | 10/1993 | Tallaksen | 29/827 |
| 5,261,999 | 11/1993 | Pinker et al. | 156/630 |
| 5,311,396 | 5/1994 | Steffen | 257/679 |
| 5,399,907 | 3/1995 | Nguyen et al. | 257/679 |

*Primary Examiner*—George Fourson
*Assistant Examiner*—Long Pham
*Attorney, Agent, or Firm*—Steven R. Bartholomew

[57] ABSTRACT

Improved methods for fabricating smart cards are disclosed. Semiconductor die approximately 0.004 to 0.007 inches thick are fabricated using chemical stress relief processes and UV dicing tape. The die are positioned substantially on the neutral axis of a smart card, thereby providing smart cards having improved resistance to mechanical flexure.

3 Claims, 2 Drawing Sheets

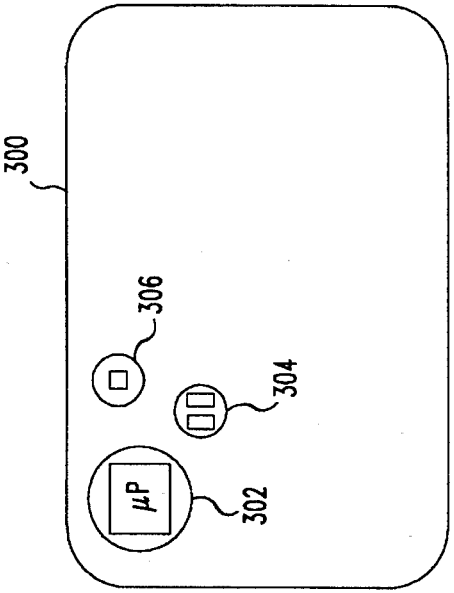
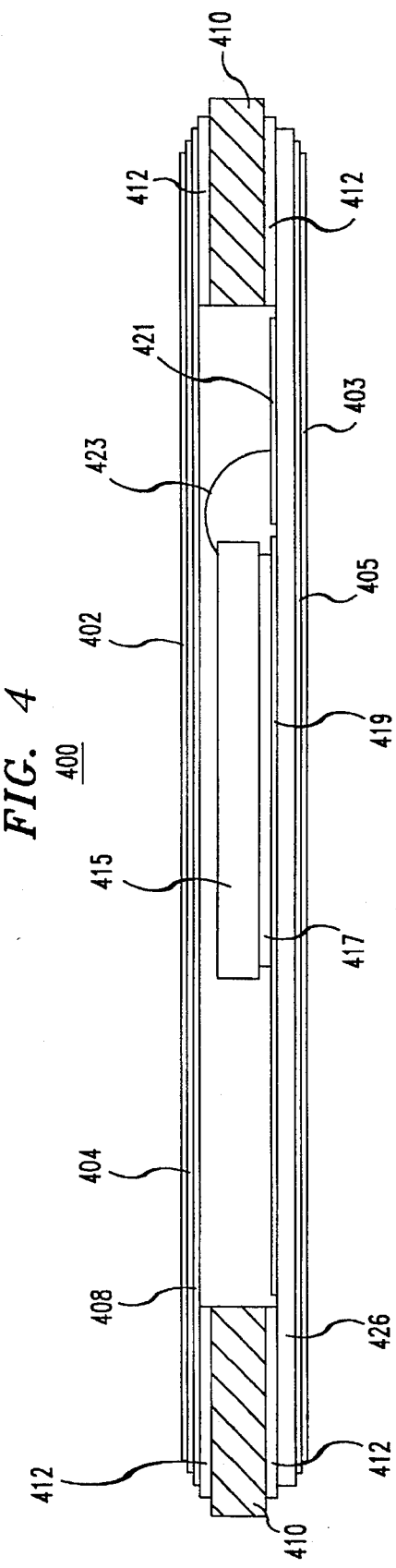

METHOD FOR FABRICATING THIN, STRONG, AND FLEXIBLE DIE FOR SMART CARDS

BACKGROUND OF THE INVENTION

1. Field of the Invention

This invention relates generally to semiconductor fabrication processes, and more particularly to fabrication processes used in the manufacture of smart cards.

2. Description of the Prior Art

The primary failure mode of existing smart cards is semiconductor die breakage resulting from applied mechanical stress. Unfortunately, mechanical stress is inherent in typical smart card operational environments, such as point-of-sale terminals, credit card reading devices, wallets, pockets, and purses. Semiconductor die strength is a significant factor in determining the overall durability and reliability of a smart card. Die thickness directly affects the ability of a semiconductor die to withstand flexure and applied mechanical force.

Existing smart card packages are approximately 0.030 inches thick. This dimension places constraints on the maximum allowable thickness of the semiconductor die which will fit within the package. In addition to the die itself, space must also be allocated for lead termination, protection, labeling, magnetic striping, and discrete circuit components. Therefore, die thicknesses on the order of 0.011 inches are employed, representing the maximum die thickness that can easily fit within a smart card package. Semiconductor die thinner than 0.011 inches are not generally used in smart cards, as such die have traditionally been difficult and expensive to fabricate. Furthermore, conventional wisdom dictates that, as the thickness of a die is decreased, the die become increasingly vulnerable to mechanical failure. For all of the aforementioned reasons, existing smart card design approaches have not advantageously exploited the use of die thinner than 0.011 inches.

One shortcoming of existing 0.011-inch die is that the die do not provide optimum immunity to mechanical flexure. Flexure is an important physical property to consider for certain specific applications such as smart cards. In order to improve performance in this area, existing approaches have focused on strengthening the die itself, generally through the optimization of specific individual design parameters, such as grinding parameters, dicing parameters, and others. As opposed to integrating these design parameters into a broad-based design solution, prior art approaches have generally adopted a piecemeal approach by considering the effects of only one or two design parameters on flexure resistance. In material systems having high thermal coefficients of expansion, design parameters have been optimized for the purpose of increasing die tolerance to severe thermal transient conditions. However, existing die strength improvement efforts have not adequately addressed applications involving physical die flexure.

Existing chemical stress relief processes have not been directed towards the goal of improving die strength. Rather, these stress relief processes are used to remove silicon and thin silicon wafers, flatten wafers that are warped, and repair damage caused by wafer grinding. Wafers are typically subjected to mechanical thinning operations for purposes of processing and testing. Mechanical thinning places stress concentrations on the wafers, resulting in the aforementioned wafer warpage, which is corrected using chemical methods such as acid baths. The purpose of existing chemical stress relief processes is to repair wafer damage which may occur during wafer fabrication and processing.

It would be desirable to develop a chemical stress relief process which is directed to improving die strength. Although a pure crystal of silicon has an inherent maximum strength, the strength of a crystal fabricated in conformance with state-of-the-art technology is compromised by the existence of crystallographic defects such as chips, scratches, inclusions, and lattice dislocations. Chipping may result during the dicing and/or die handling process. Prevention or removal of these defects will enhance the actual strength of the crystal. For example, existing semiconductor integrated circuits typically have greater resistance to mechanical stress which is applied at the front or side of the circuit, as opposed to the back of the circuit. This phenomenon is due to crystallographic defects introduced in the fabrication process. Accordingly, it would be desirable to develop a chemical etching or dissolution process to eliminate the stress concentration and crack initiation points in the crystal lattice structure.

Traditional smart card packaging techniques place the semiconductor die near the surface of the card, due to tight packaging and interconnect requirements, and also because the thickness of the die represents a substantial portion of the thickness of the actual smart card package. However, during mechanical flexure, the mechanical stresses are greatest near the card surface, and at a minimum value on the neutral axis of the card, i.e., at a depth equal to half the card thickness. Since the stresses are low or zero at this axis, it would be desirable to position the semiconductor die at this location. However, even if an existing 0.011 inch die is centered on the neutral axis, the sheer thickness of the die itself results in portions of the die being located in higher stress regions near the surface of the card. What is needed is a thinner die, such that the entire die can be situated at or near the neutral axis.

SUMMARY OF THE INVENTION

Improved methods for fabricating smart cards are disclosed. Semiconductor die approximately 0.004 to 0.007 inches thick are fabricated using chemical stress relief processes and UV dicing tape. The die are positioned substantially on the neutral axis of a smart card, thereby providing smart cards having improved resistance to mechanical flexure.

BRIEF DESCRIPTION OF THE DRAWINGS

FIG. 3 is a plan view of a smart card showing representative locations for various smart card components; and FIG. 4 is a cross-sectional view of a semiconductor die produced in conformance with the procedures of FIG. 1.

DESCRIPTION OF THE PREFERRED EMBODIMENTS

Figure 1:
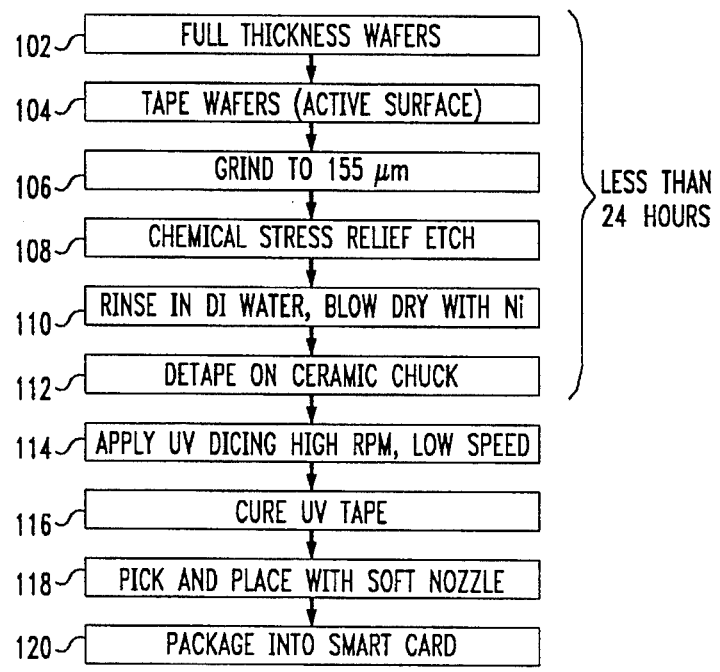
FIG. 1 is a flowchart setting forth a sequence of steps implemented by an improved smart card fabrication process.

FIG. 1 is a flowchart setting forth a sequence of steps implemented by an improved smart card fabrication process. The process commences at block 102 with conventional, full thickness semiconductor wafers of a type known to those skilled in the art. These wafers are mapped to allow for the identification of specific die in subsequent processing steps, thus permitting the locations of bad or defective die to be specified for future reference. Prior art methods of identifying bad or defective die operate by marking these die with ink dots. However, these ink dots have a finite height or thickness which is not negligible. The height of an ink dot, when sandwiched between the die surface and the protective tape used for frontside wafer protection during wafer thinning/grinding, create high spots that cause localized stress during the grinding operation. These localized stress points can introduce dislocations in the crystal lattice structure of the wafer which, in turn, cause weak die. The use of wafer mapping for die identification eliminates the ink dots, the resulting stress points, and the resultant weak die created from the aforementioned thinning/grinding operation.

At block 104, the active (i.e., front) surface of the wafers are taped for protection with a low tack wafer grinding tape. Next (block 106), the wafers are ground to a thickness of approximately 155 um. The grinding step can be implemented, for example, using an infeed-type, single-chuck table grinding machine such as a machine known to those skilled in the art as a Strasbaugh 7AA grinder.

The protective tape is left on the waters for a period of time not to exceed 24 hours. During this 24-hour period, the taped wafers are ground and chemically etched (block 108). This etching process is directed to strengthening the semiconductor crystal by removing crystal defects and repairing grinding damage to the crystal lattice. As was previously stated in the Background of the Invention, existing chemical stress relief processes have not been directed towards the goal of improving die strength. Rather, these stress relief processes have been used to remove silicon and thin silicon wafers, flatten wafers that are warped, and repair damage caused by wafer grinding. Wafers are typically subjected to mechanical thinning operations for purposes of processing and testing. Mechanical thinning places stress concentrations on the wafers, resulting in the aforementioned wafer warpage, which is corrected using chemical methods such as acid baths. Therefore, the main purpose of existing chemical stress relief processes is to repair wafer damage which occurs during wafer fabrication and processing.

The chemical stress relief process of Block 108 is directed to improving die strength, minimizing stress concentration points, and eliminating crack initiation points in the crystal lattice structure. Although a pure crystal of silicon has an inherent maximum strength, the strength of a crystal fabricated in conformance with state-of-the-art technology is compromised by the existence of crystallographic detects such as chips, scratches, inclusions, and lattice dislocations. Prevention or removal of these defects enhances the actual strength of the crystal. For example, existing semiconductor integrated circuits typically have greater resistance to mechanical stress which is applied at the front or side of the circuit, as opposed to the back of the circuit. This phenomenon is due to the existence of crack initiation points caused by the wafer fabrication process.

The chemical stress relief process of Block 108 chemically etches the wafers in an acid bath of approximately 7:2:1 Nitric Acid: Hydrofluoric Acid: Acetic Acid for approximately one minute at ambient room temperature. Following the acid bath, the wafers are rinsed in a DI water bath for a period of about 10 minutes to remove residual acid, and blown dry with a nitrogen gun (block 110). The wafers are positioned on a flat, porous ceramic wafer chuck, where the wafers are detaped. The chuck applies a substantially uniform vacuum across the wafer surface to prevent water flexure during removing the protective grinding tape (block 112).

After detaping, the wafers are diced using a high-RPM, low-speed dicing saw such as a through-cut, low feed rate dicing saw having a high spindle speed and an ultrathin resin bonded dicing blade (block 114), utilizing UV dicing tape. Such saws and blades are well-known to those skilled in the art. Note that many prior art dicing techniques and processes can introduce chipping into both the front and backside edges of the die due to such factors as blade loading, depth of the cut, feed rates, blade width, coolant, blade orientation with reference to the crystal lattice, tape adhesion, and die rotation. If these factors are optimized during the dicing step (block 114), the concentration and size of chipouts can be reduced greatly, thereby increasing the strength of the die by eliminating or reducing stress concentration points and crack initiation points.

The selection of specific die handling techniques will minimize damage to the crystal lattice structure of the wafers. For example, many existing die handling techniques introduce frontside and backside damage to the wafers which significantly reduces die strength. Die collets can cause chips on the front edge of the wafer, and these chips serve as potential crack initiation points. Die ejection pins can scratch, chip, and/or cause crystal dislocations that reduce the overall strength of the die. The use of soft rubber or plastic die pickup heads, UV dicing tape, non-piercing ejector pins, and servo or programmable dynamics ejector pins will reduce or eliminate or reduce die damage relative to currently utilized methods. Die damage may also be eliminated or reduced by using alternate die removal devices such as die/tape peeling fixtures.

After dicing, the wafers are exposed to UV light (block 116). The UV light cures the tape adhesive on the wafers and reduces the adhesion of the tape to the die backside surface. UV dicing tape provides the benefit of high holding power during dicing, which serves to reduce die rotation and the resulting die chips. An additional advantage of UV dicing tape is that, after dicing and UV exposure, tape adhesion is greatly reduced. Consequently, the force necessary to eject or remove the die from the tape is also reduced, which lessens die damage due to ejector pin scratches, chipping, and/or crystal lattice dislocations.

At block 118, the die are ejected from the tape. This process may be implemented using velocity-controlled or programmable servo-controlled, non-piercing ejector pins. The die ejected by the pins are then picked up by a soft die pick nozzle and placed onto an epoxy-coated die pad. Finally, at block 120, the die are packaged into smart cards as will be described more fully hereinafter with reference to FIGS. 2–4.

The process of FIG. 1 is employed to provide semiconductor die having a thickness of approximately 0.006 inches. Although this is very thin compared to prior art 0.011-inch die, a thin die imparts many advantageous characteristics to smart card design applications. A thin die consumes less packaging space than a thick die, and also provides greater mechanical flexibility relative to die which are only sufficiently thin to fit within a smart card. For example, the typical 0.011-inch die used in smart cards will not deflect as far as an 0.006-inch die if both die are of identical strengths.

As contrasted to prior art methods which focus on optimizing one or two design parameters, the method shown in FIG. 1 integrates several approaches to provide a die having superior strength and mechanical flexibility. The die created using the procedures described above in connection with FIG. 1 exhibit relatively high die strength for increased tolerance to mechanical flexures which occur in typical smart card operational environments such as wallets, purses, reader/writer insertions, and others. Although some prior art approaches are directed to protecting and/or shielding the die from mechanical forces, the method of FIG. 1 conceptualizes the die as a major structural component of the smart card.

Figure 2:
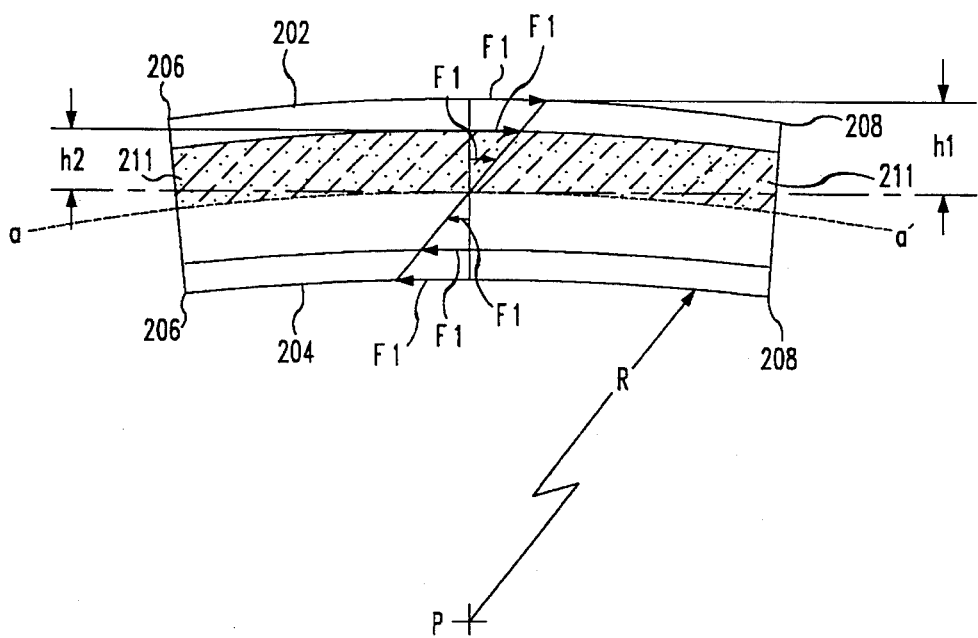
FIG. 2 is a cross-sectional view showing a smart card in a state of mechanical flexure.

The concept of mechanical flexure is illustrated in FIG. 2, which shows a cross-sectional view of a smart card 200 being flexed. If smart card failure is to be avoided, one must assume that smart cards will be exposed to flexure during conditions of ordinary or typical usage. A smart card 200 having a thickness 2*h1, upper surface 202, lower surface 204, right hand edge 208, and left hand edge 206 is flexed (bent), thus forming an arcuate surface at a radius R from focal point P. In other words, the edges 206, 208 of smart card 200 are being forced together, and the middle of the smart card is being pushed upwards. This may happen if smart card 200 is resting on a surface, and someone grasps the card at opposite ends with thumb and fingertips while moving thumb and fingertips closer together. A die 211 is incorporated into smart card 200 having a thickness of h2.

The forces within smart card 200 are shown as force components F1. Note that these forces are largest near smart card surfaces 202, 204 and are zero or at a minimum along axis a-a', where a-a' is at a distance h1 from smart card surfaces 202, 204 or, in other words, halfway between the smart card surfaces 202, 204. Force components F1 are directly proportional to the distance from axis a-a'. The greatest stress is exerted upon smart card components situated at the greatest distance from axis a-a'. Consequently, axis a-a' may be referred to as the neutral axis of the smart card. For a given value of force components F1, i.e., for a given amount of loading corresponding to a given value of R for bending, reducing h2 reduces the amount of stress on the smart card die.

Traditional smart card packaging techniques place the die near the surface of the card due to stringent packaging and interconnect requirements. On the other hand, die fabricated using the process of FIG. 1 are situated as close as possible to the neutral axis a-a' of smart card 200. In this manner, the effective level of mechanical stress transmitted to the die by the smart card package during flexure is minimized. The smart card package thus affords extra protection to the die by reducing the mechanical forces realized upon the die.

A plan view of the smart card described in connection with FIG. 2 is illustrated in FIG. 3. Referring now to FIG. 3, a smart card 300 is shown, along with representative locations for various smart card components. For example, smart card 300 includes microprocessor 302, a power input port 304, and a data transfer port 306.

FIG. 4 is a cross-sectional view of a smart card 400 produced in conformance with the procedures of FIG. 1. The smart card includes one or more PVC labels 402, 403 which are affixed to upper and lower surfaces, respectively, of smart card 400 with adhesive layers 404, 405, respectively. Adhesive layer 404 adjoins woven material 408. Woven material 408 is affixed to polyester structural members 410 using an adhesive layer 412. Polyester structural members 410 are configured to form a cavity, in which is mounted a semiconductor die 415. Die attach epoxy is used to mount the semiconductor die 415 onto a copper pad 419. Copper pad 419 is traced onto a polyester printed circuit board 426, which may include additional copper pads 421. All or some of these additional copper pads 421 may be electrically connected to the semiconductor die via one or more wire bonds 423. Adhesive layer 405 is used to attach PVC label 403 to the underside of the printed circuit board 426.

What is claimed:

1. A method for fabricating a plurality of smart card semiconductor die from a full thickness semiconductor wafer including the following steps:

(a) mapping the semiconductor wafer to identify, specific semiconductor die, thus permitting the locations of bad or defective die to be specified for future reference;

(b) taping a first surface of the semiconductor wafer with protective tape;

(c) grinding the semiconductor wafer to a thickness of approximately 155 um;

(d) allowing the protective tape to remain on the wafers for a period of time not to exceed 24 hours;

(e) during the period of time specified in step (d), chemically etching the semiconductor wafer to strengthen the wafer by removing crystal defects and by repairing crystal lattice damage; the etching process including the step of immersing the wafer in an acid bath of approximately 7:2:1 Nitric Acid: Hydrofluoric Acid: Acetic Acid for approximately one minute at ambient room temperature;

(f) rinsing the wafer in a deionized water bath for a period of about 10 minutes to remove residual acid:

(g) blowing the wafer dry with a Nitrogen gun;

(h) positioning the wafer on a flat, porous ceramic wafer chuck; the chuck equipped to apply a substantially uniform vacuum across the wafer surface to prevent water flexure during step (j);

(j) detaping the protective tape from the wafer:

(k) taping the wafer with dicing tape;

(l) dicing the wafer using a dicing saw;

(m) exposing the wafers to UV light to cure the UV dicing tape on the wafers and to reduce the adhesion of the tape to the die; and (n) ejecting the die from the UV dicing tape using non-piercing ejector pins and soft rubber or plastic die pickup heads, thereby reducing or eliminating die damage.

2. A method for fabricating a plurality of smart card semiconductor die from a full thickness semiconductor wafer including the following steps:

(a) mapping the semiconductor wafer to identify specific semiconductor die, thus permitting the locations of bad or defective die to be specified for future reference;

(b) taping a first surface of the semiconductor wafer with protective tape;

(c) grinding the semiconductor wafer to a thickness of approximately 155 um;

(d) allowing the protective tape to remain on the wafers for a period of time not to exceed 24 hours;

(e) during the period of time specified in step (d), chemically etching the semiconductor water to strengthen the wafer by removing crystal defects and by repairing crystal lattice damage; the etching process including the step of immersing the wafer in an acid bath of approximately 7:2:1 Nitric Acid: Hydrofluoric Acid: Acetic Acid for approximately one minute at ambient room temperature;

(f) rinsing the wafer in a deionized water bath for a period of about 10 minutes to remove residual acid;

(g) drying the wafer;

(h) positioning the wafer on a substantially flat surface equipped to apply a substantially uniform vacuum across the wafer surface to prevent wafer flexure during step (j);

(j) detaping the protective tape from the wafer;

(k) taping the wafer, with UV dicing tape, to a dicing frame;

(m) dicing the wafer using a dicing saw;

(n) exposing the wafers to UV light to cure the UV dicing tape on the wafers and to reduce the adhesion of the tape to the die; and (p) ejecting the die from the UV dicing tape using non-piercing ejector pins and soft die pickup heads, thereby reducing or eliminating die damage.

3. A method for fabricating a plurality of smart card semiconductor die from a full thickness semiconductor wafer including the following steps:

(a) mapping the semiconductor wafer to identify specific semiconductor die, thus permitting the locations of bad or defective die to be specified for future reference;

(b) taping a first surface of the semiconductor wafer with protective tape;

(c) grinding the semiconductor wafer to a thickness of approximately 155 um;

(d) allowing the protective tape to remain on the wafers for a period of time not to exceed 24 hours;

(e) during the period of time specified in step (d), chemically etching the semiconductor wafer to strengthen the wafer by removing crystal defects and by repairing crystal lattice damage; the etching process including the step of immersing the water in an acid bath;

(f) rinsing the wafer in a deionized water bath to remove residual acid;

(g) drying the wafer;

(h) positioning the wafer on a surface equipped to apply a substantially uniform vacuum across the wafer surface to prevent wafer flexure during step (j);

(j) detaping the protective tape from the wafer;

(k) taping the wafer, with UV dicing tape, to a dicing frame;

(m) dicing the wafer using a dicing saw;

(n) exposing the wafers to UV light to cure the UV dicing tape on the waters and to reduce the adhesion of the tape to the die; and (p) ejecting the die from the UV dicing tape using non-piercing ejector pins and soft die pickup heads, thereby reducing or eliminating die damage.

* * * * *